(12) United States Patent
Seo et al.

(10) Patent No.: US 8,704,265 B2
(45) Date of Patent: Apr. 22, 2014

(54) LIGHT EMITTING DEVICE PACKAGE AND LIGHTING APPARATUS USING THE SAME

(75) Inventors: Bu Wan Seo, Seoul (KR); Sung Woo Kim, Seoul (KR); Hoon Hur, Seoul (KR); Yong Suk Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 256 days.

(21) Appl. No.: 12/675,582

(22) PCT Filed: Aug. 27, 2008

(86) PCT No.: PCT/KR2008/005023
§ 371 (c)(1),
(2), (4) Date: Jul. 12, 2010

(87) PCT Pub. No.: WO2009/028869
PCT Pub. Date: Mar. 5, 2009

(65) Prior Publication Data
US 2010/0295068 A1    Nov. 25, 2010

(30) Foreign Application Priority Data

Aug. 27, 2007  (KR) .................. 10-2007-0086115
Jan. 15, 2008  (KR) .................. 10-2008-0004322

(51) Int. Cl.
| | |
|---|---|
| *H01L 33/00* | (2010.01) |
| *H01L 29/40* | (2006.01) |
| *H01L 29/207* | (2006.01) |
| *H01L 23/48* | (2006.01) |

(52) U.S. Cl.
USPC ............... 257/99; 257/100; 257/784; 257/89; 257/93; 257/98; 257/E33.058; 257/E33.059; 257/E33.061; 257/E33.066; 257/E33.068

(58) Field of Classification Search
USPC ................ 257/103, 98, 89, E25.02, E27.12; 313/503, 498, 501, 502; 362/246, 800
See application file for complete search history.

(56) References Cited

U.S. PATENT DOCUMENTS

| | | | | | |
|---|---|---|---|---|---|
| 5,998,925 | A | * | 12/1999 | Shimizu et al. | ............... 313/503 |
| 6,069,440 | A | * | 5/2000 | Shimizu et al. | ............... 313/486 |

(Continued)

FOREIGN PATENT DOCUMENTS

| | | |
|---|---|---|
| JP | 10-282916 A | 10/1998 |
| JP | 2006-049913 A | 2/2006 |
| JP | 2007-067204 A | 3/2007 |
| KR | 20-0312452 Y1 | 5/2003 |
| KR | 10-2004-0088418 A | 10/2004 |
| KR | 10-2007-0068709 A | 7/2007 |

OTHER PUBLICATIONS

PCT International Search Report dated Mar. 11, 2009 for Application No. PCT/KR2008/005023.

(Continued)

*Primary Examiner* — Zandra Smith
*Assistant Examiner* — Tsz Chiu
(74) *Attorney, Agent, or Firm* — Ked & Associates, LLP (57) ABSTRACT

In one embodiment, the light emitting device package includes a package body, electrodes attached to the package body, and at least two light emitting devices electrically connected to the electrodes. Each light emitting device emits light of a different color from the other light emitting devices. A protective layer is formed over the at least two light emitting devices, and a phosphor layer formed over the protective layer. Other embodiments include other structures such a individual phosphor layers on each light emitting device. And, a light apparatus including a package may include a single driver driving the light emitting devices of the package.

9 Claims, 11 Drawing Sheets

(56) References Cited

U.S. PATENT DOCUMENTS

| | | | |
|---|---|---|---|
| 6,498,440 B2* | 12/2002 | Stam et al. | 315/291 |
| 6,577,073 B2* | 6/2003 | Shimizu et al. | 315/246 |
| 7,157,745 B2* | 1/2007 | Blonder et al. | 257/98 |
| 7,157,839 B2* | 1/2007 | Ouderkirk et al. | 313/111 |
| 7,422,338 B2* | 9/2008 | Kono et al. | 362/27 |
| 8,217,412 B2* | 7/2012 | Yuan et al. | 257/98 |
| 8,294,156 B2* | 10/2012 | Jang et al. | 257/69 |
| 8,324,654 B2* | 12/2012 | An et al. | 257/99 |
| 2004/0150991 A1* | 8/2004 | Ouderkirk et al. | 362/231 |
| 2004/0256626 A1 | 12/2004 | Wang et al. | 257/89 |
| 2004/0257797 A1 | 12/2004 | Suehiro et al. | 362/34 |
| 2005/0173708 A1* | 8/2005 | Suehiro et al. | 257/79 |
| 2006/0067073 A1 | 3/2006 | Ting | 362/231 |
| 2006/0124953 A1 | 6/2006 | Negley et al. | 257/99 |
| 2006/0261742 A1 | 11/2006 | Ng et al. | 315/86 |
| 2007/0147073 A1* | 6/2007 | Sakai et al. | 362/607 |
| 2009/0127576 A1* | 5/2009 | Jang et al. | 257/98 |
| 2011/0095317 A1* | 4/2011 | Kim | 257/98 |
| 2011/0095319 A1* | 4/2011 | Kim | 257/98 |
| 2011/0215349 A1* | 9/2011 | An et al. | 257/89 |

OTHER PUBLICATIONS

European Search Report dated Sep. 15, 2010 issued in Application No. 08 79 3526.

* cited by examiner

LIGHT EMITTING DEVICE PACKAGE AND LIGHTING APPARATUS USING THE SAME

TECHNICAL FIELD

The present invention relates to a light emitting device package and a lighting apparatus using the same.

BACKGROUND ART

Generally, Light Emitting Diodes (LEDs) are well-known semiconductor light-emitting devices which convert electric current into light energy. LEDs have been used as light sources for displaying images in electronic equipment such as information communication equipment, etc.

The wavelength of light emitted by such LEDs is dependent upon the types of the semiconductor materials used in the manufacture of the LEDs. This is because the wavelength of emitted light is dependent upon the band gap of the semiconductor materials, where the band gap is an energy difference between valence band electrons and conduction band electrons.

Gallium nitride (GaN) has a high thermal stability and a broad band gap (ranging from 0.8 to 6.2 eV), and therefore has received a great deal of attention in developing high-power output electronic component devices including LEDs.

One of the reasons why gallium nitride has attracted a great deal of interest is because it is possible to fabricate semiconductor layers emitting green, blue and white light, by using GaN in combination with other elements such as indium (In), aluminum (Al) and the like.

Due to the capability to control an emission wavelength via the use of GaN, the emission wavelength may be adjusted to a desired range suited for intrinsic properties of the used materials in compliance with the characteristics of specific equipment. For example, the use of GaN makes it possible to manufacture blue LEDs which are beneficial for optical writing and white LEDs which may be substituted for incandescent lamps.

Due to various advantages of such GaN-based materials, the GaN-based LED market is rapidly growing As a result, technologies of GaN-based optoelectronic devices have been rapidly advancing since their commercial introduction.

The technique of fabricating a white light emitting device using the above GaN-based LED is divided into two methods. In the first method, white light is obtained by depositing a phosphor onto a blue or UV light emitting diode chip. In the second method, white light is obtained by combining output from three different color output LED chips.

Further, the luminance of the output of the above GaN-based LED depends on the structure of an active layer, efficiency in extracting light to the outside (i.e., light extraction efficiency), the size of an LED chip, the kind and angle of a mold or resin layer when a lamp package is assembled, phosphor used, etc.

DISCLOSURE OF INVENTION

Technical Solution

The present invention relates to a light emitting device package. The present invention further relates to a lighting apparatus using the same.

In one embodiment, the light emitting device package includes a package body, electrodes attached to the package body, and at least two light emitting devices electrically connected to the electrodes. Each light emitting device emits light of a different color from the other light emitting devices. A protective layer is formed over the at least two light emitting devices, and a phosphor layer formed over the protective layer.

In one embodiment, the phosphor layer is a uniformly thick layer.

In another embodiment the light emitting device package includes a package body, electrodes formed on the package body, and at least two light emitting devices electrically connected to the electrodes. Each light emitting device emits light of a different color from the other light emitting devices. A phosphor layer associated with each light emitting device is formed over at least a portion of the associated light emitting device. A protective layer is formed over the at least two light emitting devices.

In one embodiment, each phosphor layer is uniformly formed on at least a portion of the associated light emitting device.

A still further embodiment of a light emitting device package includes a package body, electrodes attached to the package body, and at least two light emitting devices electrically connected to the electrodes. Each light emitting device emits light of a different color from the other light emitting devices. A phosphor layer having a uniform thickness is formed over at least one of the light emitting devices.

In one embodiment, a phosphor layer is formed directly on each light emitting device.

In another embodiment, the phosphor layer is formed over a protective layer on the light emitting devices.

In a further embodiment, a lighting apparatus includes a light emitting device package and a driver. The package includes at least two light emitting devices respectively emitting light of a first color and a second color that differ from each other, and a phosphor formed over the at least two light emitting devices. The driver drives the at least two light emitting devices to emit light of the first and second colors. The driver may drive the at least two light emitting devices simultaneously.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 8 to 13 are plan views illustrating a light emitting device package in accordance with a further embodiment of the present invention, more particularly:

FIGS. 14 and 15 are views illustrating a light emitting device package in accordance with a still further embodiment of the present invention, more particularly:

FIGS. 16 to 18 are views illustrating a light emitting device package in accordance with another embodiment of the present invention, more particularly:

BEST MODE FOR CARRYING OUT THE INVENTION

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example of a light emitting device using color conversion, such as a white light emitting device, white light may be obtained using a blue light emitting device and a yellow phosphor.

The blue light emitting device is used as a reference light source and blue light emitted from the blue light emitting device is projected on the yellow phosphor, (e.g., a yttrium aluminum garnet (YAG) phosphor). The YAG phosphor is excited by the incident light and emits light in a wavelength band of 500-780 nm. The white light is emitted due to color mixing of lights in this wavelength band.

In this example, a wavelength space between the blue light and the yellow light is broad, and thus may cause a flash effect due to color separation. Further, it is not easy to adjust or control the same color coordinates, color temperature, and color rendering index; and color conversion may be generated according to peripheral temperature.

Particularly, in case that a backlight unit is manufactured using such a light emitting device, the upper limit of a color reproduction range compared with NTSC is only 65%.

On the other hand, in case that white light is obtained using multi chips including red, green, and blue light emitting device chips, a color reproduction range compared with NTSC exceeds 100%.

However, in case that white light is obtained using the multi chips, the operating voltages of each of the chips are not uniform, the outputs of the chips are varied according to peripheral temperature and thus color coordinates are changed, and driving circuits must be added.

Figure 1:
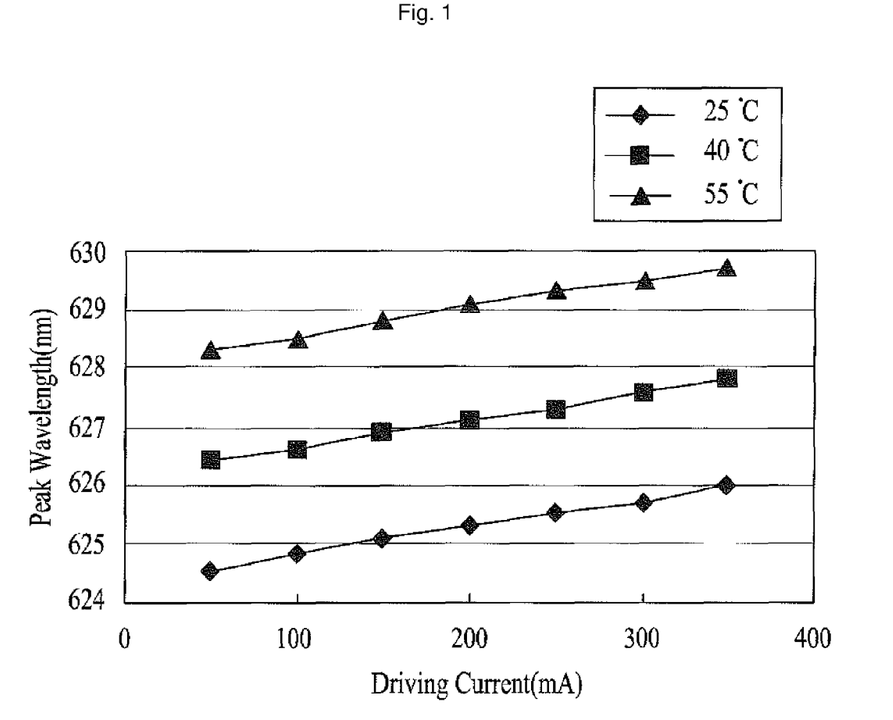
FIG. 1 is a graph illustrating wavelength dependence of a red light emitting device according to current at each temperature.
Figure 2:
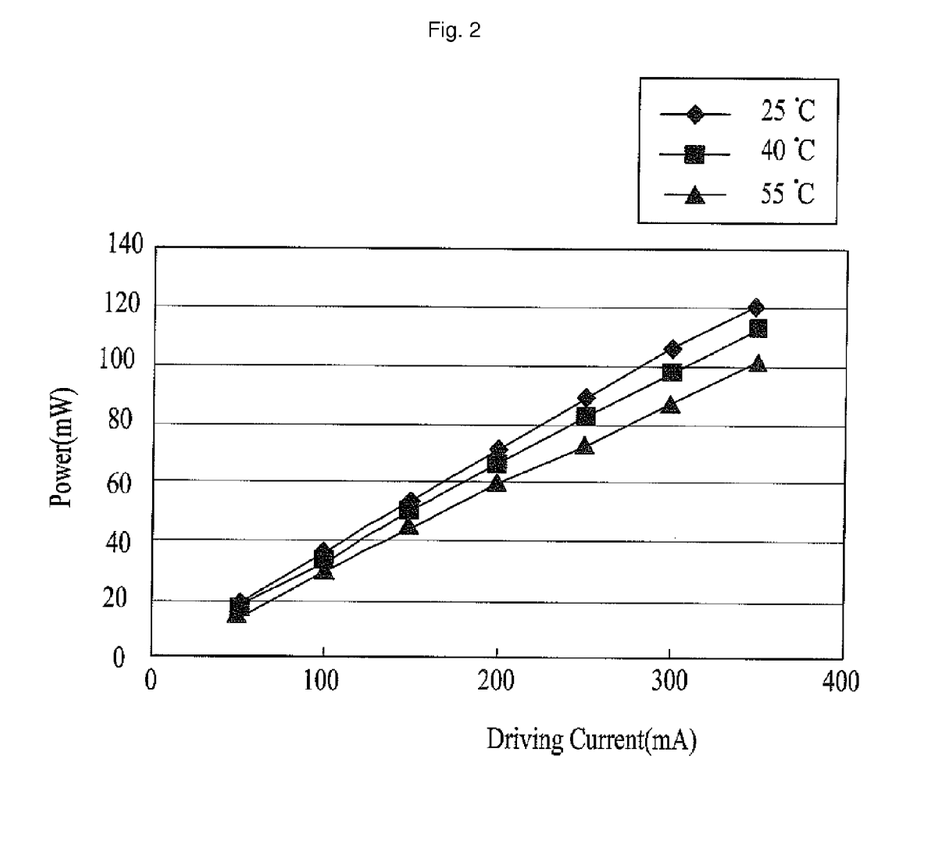
FIG. 2 is a graph illustrating power dependence of a red light emitting device according to current at each temperature.

FIGS. 1 and 2, respectively illustrate wavelength dependence and power dependence of a red light emitting device chip according to current at each temperature. Changes in color coordinates according to current and temperature caused by the red light emitting device chip among red, green, and blue light emitting device chips becomes an issue, and thus the whole color coordinates of a backlight unit may be changed.

In one embodiment, instead of three light emitting device chips, two light emitting device chips emitting light of two different colors and a phosphor excited by the light emitting device chips are used.

For example, to fabricate a white light emitting device package, a green light emitting device chip, a blue light emitting device chip, and a red phosphor excited by the light emitted from the green and blue light emitting device chips may be used.

When the above light emitting device package is used in a lighting apparatus, the lighting apparatus freely changes a color temperature and thus is capable of producing a suitable atmosphere. This light emitting device package also has the advantage of satisfying requirements of a large-scale display, such as low power consumption and high color reproduction and contrast ratio.

In association with a light emitting device package, a light emitting device driving unit is provided. The light emitting device driving unit controls current by a method, in which a switching regulator is used to control the luminance of a light emitting device.

Figure 3:
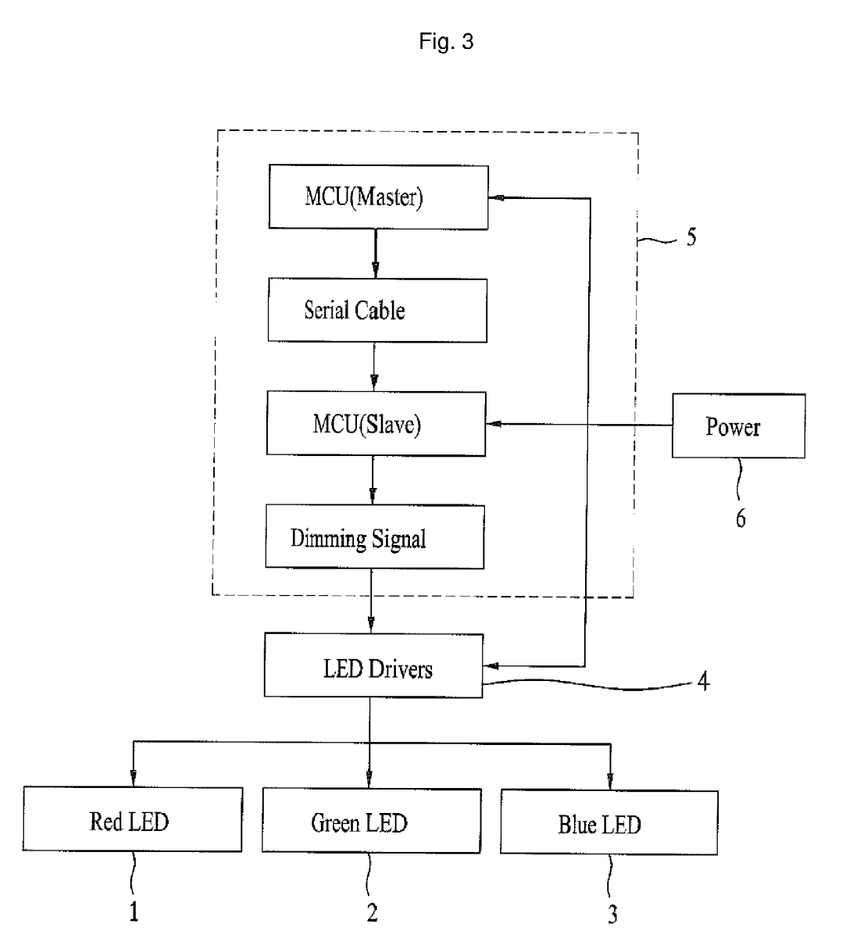
FIG. 3 is a block diagram illustrating an example embodiment of a light emitting device package driving unit.

As shown in FIG. 3, the light emitting device driving unit for package including red, green and blue light emitting device chips includes: drivers 4 driving red, green, and blue light emitting device chips 1, 2, and 3; a controller 5 transmitting a driving signal to the drivers 4; and a power supply 6. While the drivers 4 have been shown as connected to only one red, one green and one blue light emitting device chip, it will be understood that the drivers may be connected to a plurality of such chips. Furthermore, if the number of light emitting device chips is less than three, then the number of drivers is decreased accordingly.

Figure 4:
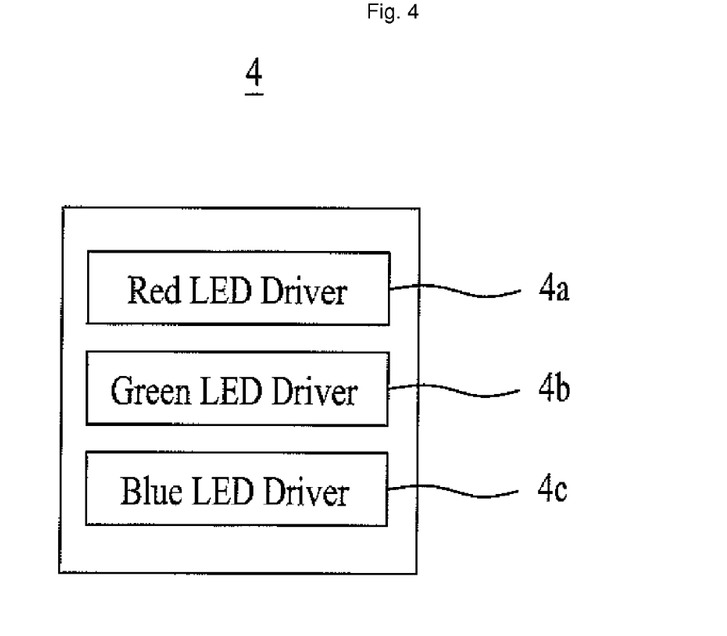
FIG. 4 is a block diagram illustrating in detail the light emitting device package driving unit of FIG. 3.

As shown in FIG. 4, the drivers 4 include individual drivers 4a, 4b, and 4c for driving the red, green and blue light emitting device chips, respectively. Accordingly, the red driver 4a may be connected to one or a plurality of red light emitting device chips, the green driver 4b may be connected to one or a plurality of green light emitting device chips and the blue driver 4c may be connected to one or a plurality of blue light emitting device chips. As mentioned above, if, for example, the red light emitting device chip or chips do not exist, then the red driver or drivers 4a may be eliminated.

In the case where a light emitting device module is arrayed with a plurality of packages and divided into driving regions, the number of the drivers is increased in proportion to the number of driving regions. For example, if a plurality of driving regions do not exist, the total number of drivers to drive red, green, and blue light emitting device chips is three, but if the light emitting device module is divided into two driving regions, the total number of drivers is increased to six. Thus, the area occupied by the drivers in a product and the cost for manufacturing the drivers are increased; and thus the total cost of the light emitting device module may increase.

According to an example embodiment, any one light emitting device chip out of the red, green, and blue light emitting device chips is substituted by a phosphor. For example, as mentioned above, a red light emitting device chip may be substituted by a red phosphor. This reduces the number of drivers needed in the resulting product. In a further embodiment, a single driver to simultaneously drive the two light emitting device chips (e.g., the green and blue light emitting device chips) is provided, thus reducing the area occupied by the drivers and the manufacturing cost of the drivers.

Figure 5:
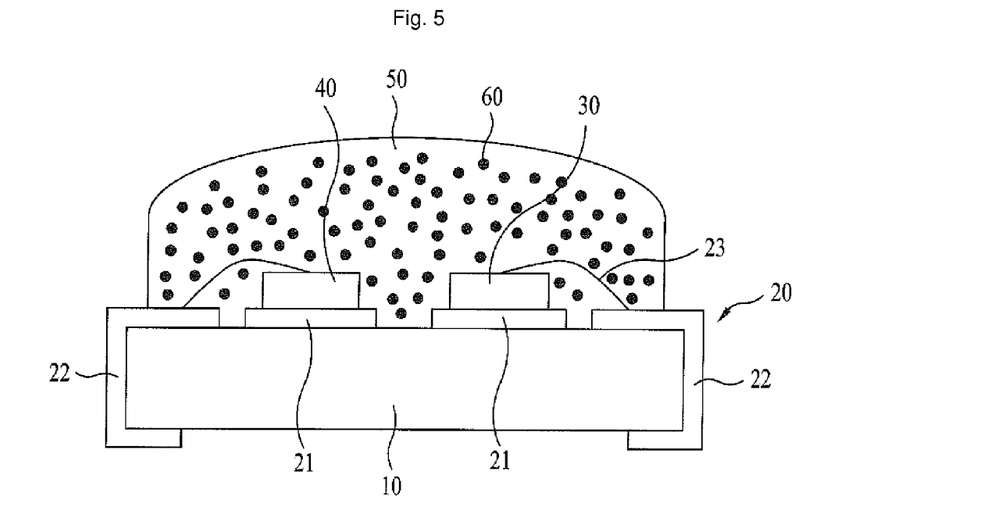
FIGS. 5 and 6 are schematic views illustrating a light emitting device package in accordance with an embodiment of the present invention.
Figure 6:
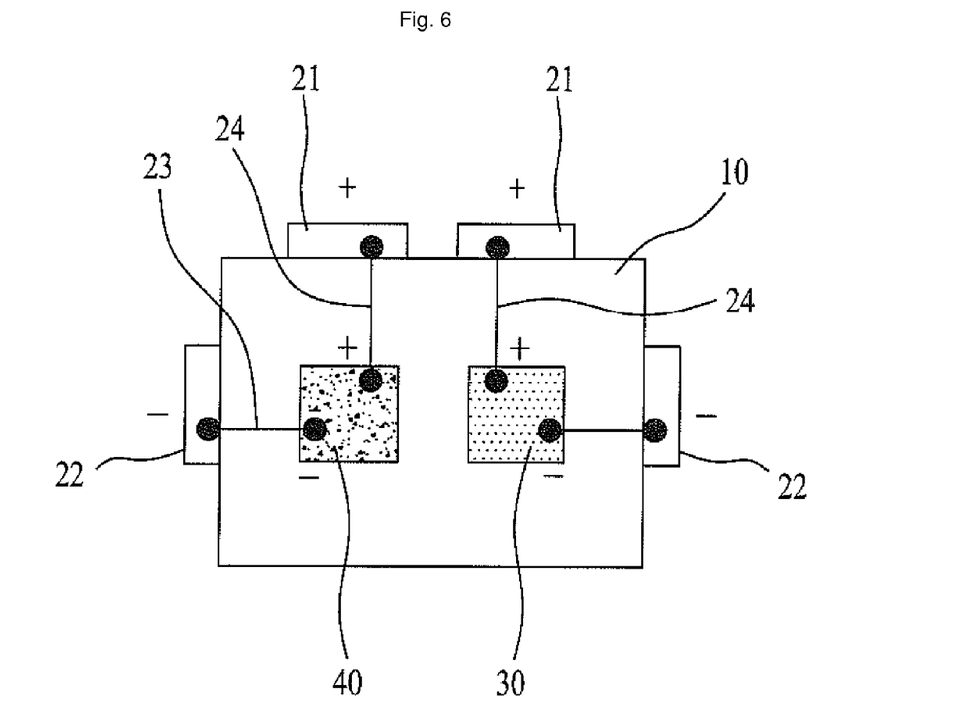

FIGS. 5 and 6 are schematic views illustrating a light emitting device package in accordance with an embodiment of the present invention. FIG. 5 illustrates a cross section view showing a package mounting vertical type light emitting devices and FIG. 6 illustrates a top view showing a package mounting lateral type light emitting devices. As shown in FIGS. 5 and 6, a light emitting device package in accordance with an embodiment includes light emitting device chips 30 and 40 (also called light emitting devices) provided on a package body 20 to emit light of different colors. A phosphor layer 50 is located on the light emitting device chips 30 and 40 to change wavelengths of light emitted from the light emitting device chips 30 and 40.

The phosphor layer 50 is obtained by mixing a phosphor powder 60 into a molding portion (in FIG. 6, the phosphor layer 50 and the phosphor powder 60 are omitted).

A substrate 10 of the package body 20 is made of insulated silicon or ceramic, and is an insulated heat sink or a lead terminal.

Electrodes 21 and 22 are formed on the substrate 10. The first electrodes 21 are form on a top surface of the substrate and connected to any one of electrodes (not shown) of the light emitting device chips 30 and 40. The second electrodes 22 are formed on sided surfaces of the substrate 10 and connected to the other one of the electrodes (not shown) of the light emitting device chips 30 and 40. In the example of FIG. 5, the chips 30 and 40 are vertical light emitting device chips having one electrode on a bottom surface of the chip and another electrode on a top surface of the chip. The first electrodes 21 may be connected to the bottom electrode by a wiring patterns 24 (see FIG. 6) formed on the substrate 10. As shown, the second electrodes 22 may be connected to the electrodes of the light emitting device chips 30 and 40 by wire bonding The second electrodes 22 extend from a top surface, along a side surface, and to a lower surface of the substrate 10. This allows the light emitting device package to be easily mounted on a printed circuit board (not shown).

The first electrodes 21 and the second electrodes 22 may be formed by a printing method. Further, the first electrodes 21 and the second electrodes 22 may be made of a metal including copper or aluminum having a high conductivity, and are electrically insulated from each other.

The light emitting device chips 30 and 40 are mounted on the package body 20 may be a top emission type or a flip chip type. FIG. 5 illustrates vertical light emitting device chips 30 and 40, which are mounted on the package body 20.

The above light emitting device chips 30 and 40, which respectively emit blue and green light in this example embodiment, are GaN-based light emitting devices, and each of the light emitting device chips 30 and 40 includes an n-type GaN layer, an active layer, a p-type GaN layer, and a p-type electrode, which are sequentially stacked on a sapphire ($Al_2O_3$) substrate. In opposition to the p-type electrode, an n-type electrode is provided on the n-type GaN layer.

Here, the active layer includes a quantum well layer, and quantum barrier layers respectively provided on the upper and lower surfaces of the quantum well layer. The active layer employs a GaN/InGaN/GaN layer or a AlGaN/InGaN/AlGaN layer, and has any one structure of a multi quantum well structure and a single quantum well structure.

In order to form a vertical structure, a conductive support layer is formed on the p-type electrode, the sapphire substrate is removed using the support layer, and the n-type electrode is formed on the n-type GaN layer, which is exposed by removing the sapphire substrate.

In the above-structured light emitting device chips 30 and 40, the support layers of the light emitting chips 30 and 40 are connected to the first electrodes 21, and the n-type electrodes of the light emitting chips 30 and 40 are connected to the second electrodes 22 via wires 23, as shown in FIG. 5.

The phosphor layer 50 formed on the upper surfaces of the light emitting devices 30 and 40 is obtained by mixing the red phosphor powder 60 into the molding portion made of a resin, such as silicon gel or epoxy resin, as described above.

The phosphor layer 50 is formed through an injection molding process using a mixture of transparent epoxy resin and the red phosphor powder 60. Further, the phosphor layer 50 is formed by pressuring or heat-treating the structure, produced using a separate mold. The phosphor layer 50 may be formed into various shapes, such as an optical lens shape, a flat panel shape, and an uneven shape having designated prominence and depression formed on the surface thereof.

Figure 7:
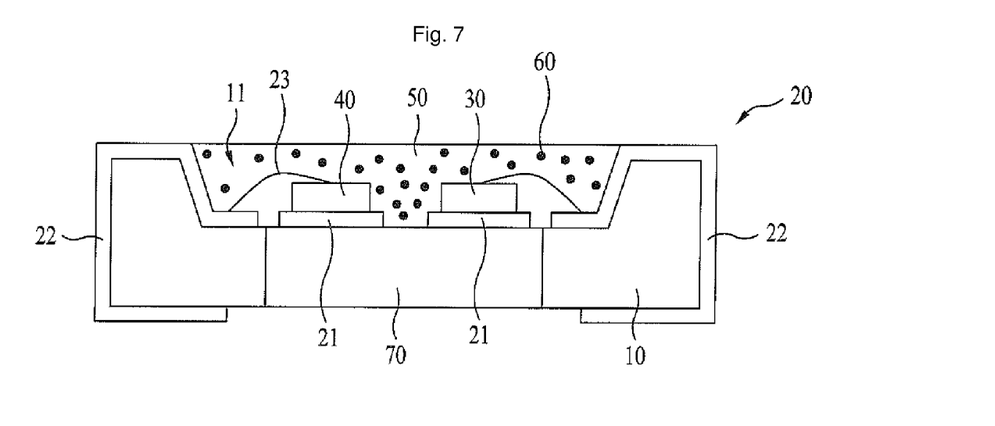
FIG. 7 is a schematic view illustrating a light emitting device package in accordance with another embodiment of the present invention.

FIG. 7 illustrates a cross-section view of another embodiment. The embodiment of FIG. 7 is the same as the embodiment of FIG. 5 except that a mounting groove 11 has been formed in the central region of the substrate 10 of the package body 20, and the light emitting device chips 30 and 40 are mounted to the substrate 10 at a bottom portion of the mounting groove 11. As shown in FIG. 7, in this embodiment side walls of the mounting groove 11 are inclined at a designated tilt. However, it will be appreciated that the side walls may be vertical.

Because the light emitting device chips 30 and 40 are mounted on the bottom surface of the mount groove 11, the reflection of light emitted from the light emitting device chips 30 and 40 is maximized and thus the light emitting efficiency of the light emitting device chips 30 and 40 is increased. Further, a heat sink 70 to radiate heat generated from the light emitting device chips 30 and 40 to the outside is further provided on the package body 20.

In this and previous embodiments, the substrate 10 may be formed using a semiconductor wafer made of silicon. In case that the substrate 10 is separated from another substrate by wet etching, the substrate 10 may have inclined side surfaces (not shown).

In the embodiment of FIG. 7, the phosphor layer 50 fills the mounting groove 11, and has an even outer surface or an outer surface having a lens shape. Namely, the phosphor layer 50 may be coated in the mounting groove 11 such that phosphor layer 50 has a substantially planar upper surface. Alternatively, the phosphor layer 50 may be formed and planarized (e.g., by chemical mechanical polishing) to have a planar upper surface. In the embodiment of FIG. 7, the upper surface of the phosphor layer 50 is shown to be in-plane with an upper surface of the package body 20.

In this and the previously described light emitting device package embodiments, the blue light emitting device chip 30 and the green light emitting device chip 40 emit primary light, the red phosphor 60 is excited by the primary light, and the red phosphor 60 emits secondary light having a changed wavelength. Color in a desired spectrum range is obtained due to the color mixing of the above lights.

An example of a backlight unit manufactured using the above-described light emitting device package includes a light source including a green light emitting device chip 40 to emit green light having a peak wavelength band of 510~550 nm, a blue light emitting device chip 30 to emit blue light having a peak wavelength band of 420~460 nm, and a color mixing unit (e.g., the molding portion 50) to mix the green light and the blue light emitted from the green and blue light emitting device chips 40 and 30 with red light emitted from a red phosphor 60, which is excited by the light source to emit the red light having a peak wavelength band of 610~680 nm.

Further, by adjusting emission intensities of the green light and the blue light emitted from the green light emitting device chip 40 and the blue light emitting device chip 30, the half bandwidth (hw) of the spectrum of the green light is set to 30~40 nm and the half bandwidth (hw) of the spectrum of the blue light is set to a designated value. Thus, the spectrum of the red light having a half bandwidth (hw) of 20~30 nm can be obtained.

The above-described light emitting device chips 30 and 40 may emit light of other colors in addition to blue and green light, and the phosphor layer 50 may use the phosphor 60 emitting light of other colors in addition to red light. For example, chips 30 and 40 may emit blue and red light, respectively, and phosphor layer 50 may be green phosphor.

As described above, light having various colors can be obtained by using the light emitting devices 30 and 40 emitting light of different colors, and the phosphor 60 excited by the light emitted by at least any one of the light emitting devices 30 and 40 and thus emitting light.

As described above, it is possible to manufacture a light emitting device package having a high color reproduction range due to characteristics including high light emitting efficiency, high color rendering, and stable color temperature and color coordinates.

In case that a backlight unit of a liquid crystal display is manufactured using the above light emitting device package, the backlight unit uses blue and green light emitting devices and a red phosphor, and does not have changes in color temperature and color coordinates. Thus such a backlight unit has stable optical characteristics.

Further, the backlight unit reduces the number of light emitting device chips and increases yield. This provides advantages in cost.

Further, the backlight unit secures a color reproduction range equal to 100% or more, and thus is capable of displaying dark and light colors clearly.

Figure 8:
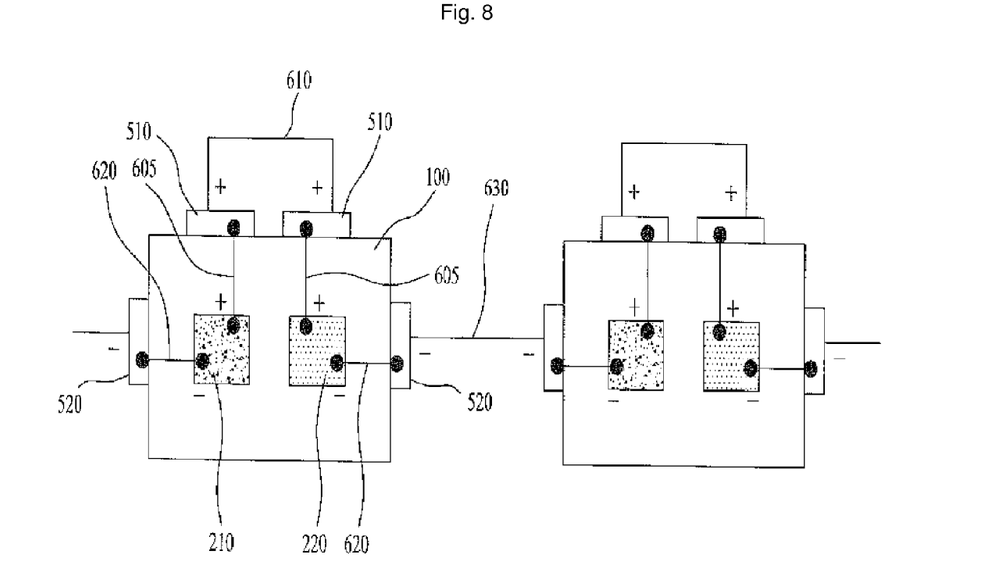
FIG. 8 is a schematic view illustrating the connection between packages.

FIG. 8 illustrates a top view of a light emitting device package according to another embodiment. This embodiment includes first and second light emitting device chips 210 and 220 mounted on substrate 100 and connected to first electrodes 510 by wiring patterns 240. The first and second light emitting chips 210 and 220 are also connected to second electrodes 520 by wires 620. In particular, this embodiment is describing a series connection of light emitting chips shown in the embodiment of FIG. 6, thus, the first electrodes 510 are electrically connected to each other and the second electrodes 520 are connected to each other. For example, as shown in FIG. 8, the first electrodes 510 may be connected by wire 610, the second electrodes 520 are connected to the chips 210 and 220 by a wire (or wires) 620, and each package is connected by wire 630. It will be understood that the structures, materials, advantages etc. discussed above with respect to FIGS. 5 and 6 equally apply to the embodiment of FIG. 8.

The structure of FIG. 8 provides for simultaneously driving the blue and green light emitting device chips 210 and 220.

That is, the blue and green light emitting device chips 210 and 220 are electrically connected to first electrodes 510 via wires 605, and are electrically connected to second electrodes 520 via wires 620. Since the first electrodes 510 are separated from each other, the first electrodes are connected by a wire 610. And, because the second electrodes 520 are separated from each other, the two second electrodes 520 are connected to each other via wires 620.

Since the two light emitting device chips 210 and 220 are connected to each other, as described above, the two types or two kinds of the light emitting device chips 210 and 220 may be driven simultaneously using a single driver, which will be described below with respect to FIG. 13. Further, since a red phosphor 300 covering the chips 210 and 220 (see FIG. 11 described below) emits light by the driving of the blue and green light emitting device chips 210 and 220, it is possible to emit white light as in the other above described embodiments.

FIG. 8 also shows that two or more lighting device packages can be connected to each other in cascade via a wiring 630 of a circuit board, and the plurality of light emitting device packages may be simultaneously driven.

Figure 9:
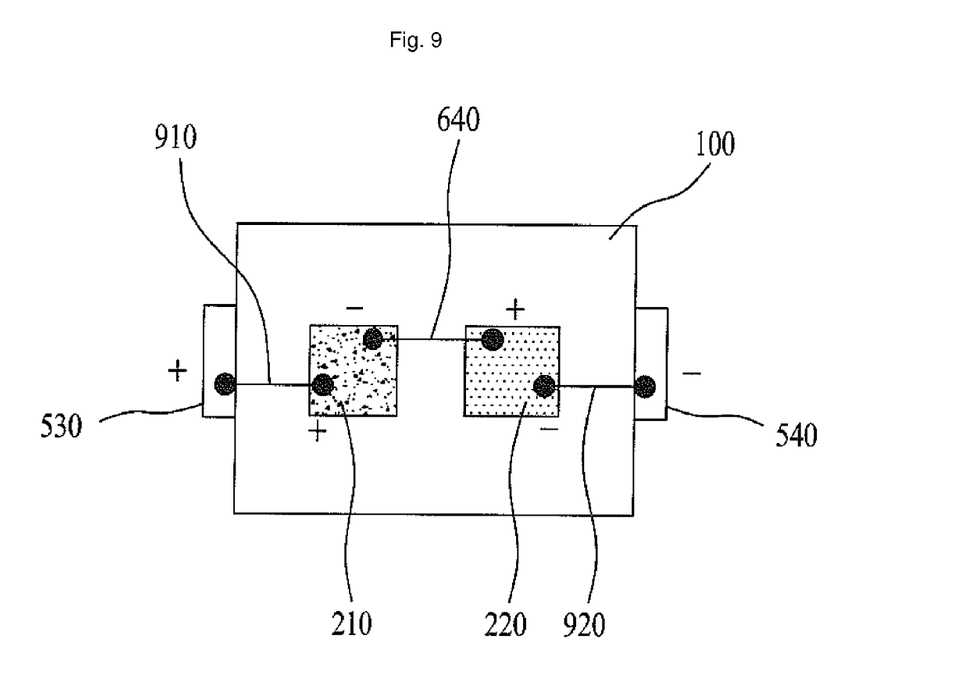
FIG. 9 is a schematic view illustrating a series connection between light emitting device chips.
Figure 10:
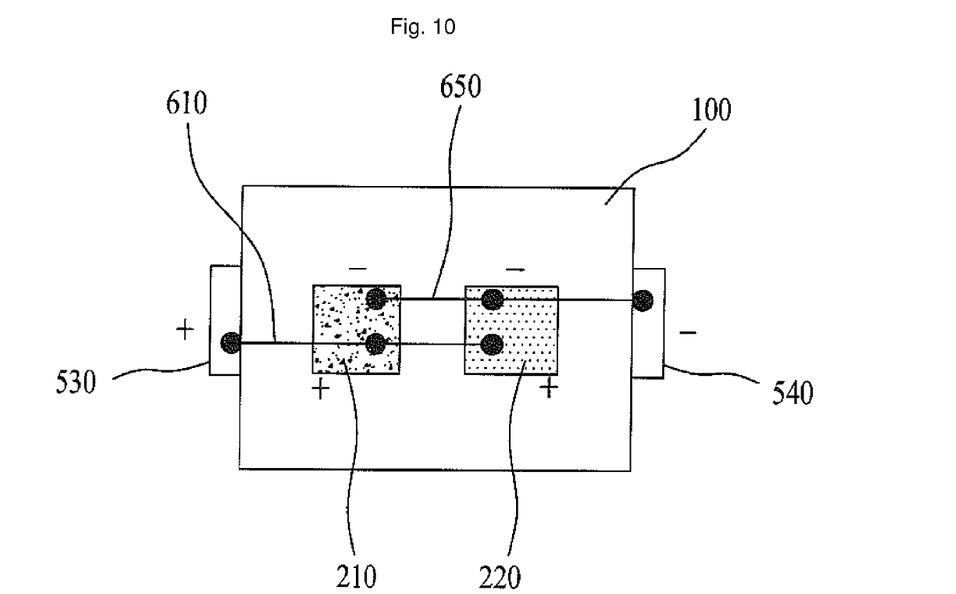
FIG. 10 is a schematic view illustrating a parallel connection between light emitting device chips.

FIGS. 9 and 10 illustrate alternative structures for connecting each light emitting chip and connecting the light emitting chips to the first and second electrodes. Namely, the embodiments of FIGS. 9 and 10 are the same as the embodiment of FIG. 8 except that a first electrode 510, relabeled as first electrode 530 replaces one of the second electrodes and is disposed on an opposite side of the substrate 100 from the side having the second electrode 540.

The blue and green light emitting device chips 210 and 220 are directly connected in series, as shown in FIG. 9, or are connected in parallel, as shown in FIG. 10.

As shown in FIG. 9, the first electrode 530 is connected to the blue light emitting device chip 210 by a wire 910. The second electrode 540 is connected to the green light emitting device chip 220 by a wire 920. The two light emitting device chips 210 and 220 are connected in series by a wire 640. Namely, as discussed above, each chip includes two electrodes, a first chip electrode and second chip electrode. The first electrode 530 is connected to the first chip electrode of the blue light emitting device chip 210 by the wire 910, the second electrode 540 is connected to the second chip electrode of the green light emitting device chip 220 by the wire 920, and the wire 640 connects the second chip electrode of the blue light emitting device chip 210 to the first electrode of the green light emitting device chip 220.

As shown in FIG. 10, the first wire 610 connects the first electrode 530 to first chip electrodes of the blue light emitting device chip 210 and the green light emitting device chip 220, and a second wire 650 connects the second electrode 540 to the second chip electrodes of the green light emitting device chip 220 and the blue light emitting device chip 210.

The above-structured light emitting device chips 210 and 220 and the package are driven by a current driving method. For example, if rated current of respective chips is 20 mA, in case of divisional driving, current of 20 mA (Vf: 3.2V) is respectively applied to each of divided driving regions. However, in the package structure in accordance with this embodiment, when the light emitting device chips 210 and 220 are connected in series, as shown in FIGS. 8 and 9, current of only 20 mA (Vf: 6.4V) is applied to drive the package.

Further, when the light emitting device chips 210 and 220 are connected in parallel, as shown in FIG. 10, current of only 40 mA (Vf: 3.2V) may be applied to drive the package.

Since the light emitting apparatus does not require three or two drivers, but can be driven by changing only current and voltage levels using a single driver, the structure of a driving plane of the light emitting apparatus is simplified.

Figure 11:
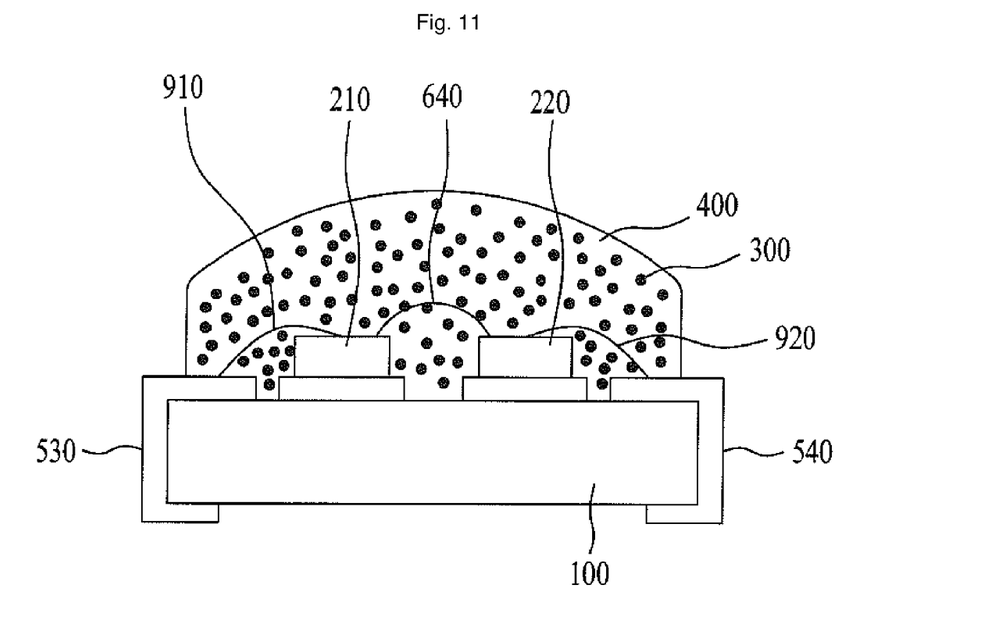
FIG. 11 is a cross-sectional view of FIG. 9.

FIG. 11 illustrates the cross-section of the package illustrated in FIG. 9. That is, the first electrode 530 and the second electrode 540 are located on the substrate 100, the blue light emitting device 210 and the green light emitting device 220 are respectively connected to the first electrode 530 and the second electrode 540 via wire 910 and 920, respectively, and the blue light emitting device 210 and the green light emitting device 220 are connected to each other in series via the wire 640.

A molding portion 400 made of a resin is located on the light emitting devices 210 and 220, and a red phosphor 300 is dispersed in the molding portion 400. In some cases, the phosphor 300 is not dispersed in the molding portion 400, but a separate phosphor layer (not shown) may be located on the upper or lower surface of the molding portion 400.

Combinations, which can emit white light, other than the above combination of the blue and green light emitting device chips and the red phosphor are possible, or other combinations, which can emit light of colors other than white light, are possible.

Figure 12:
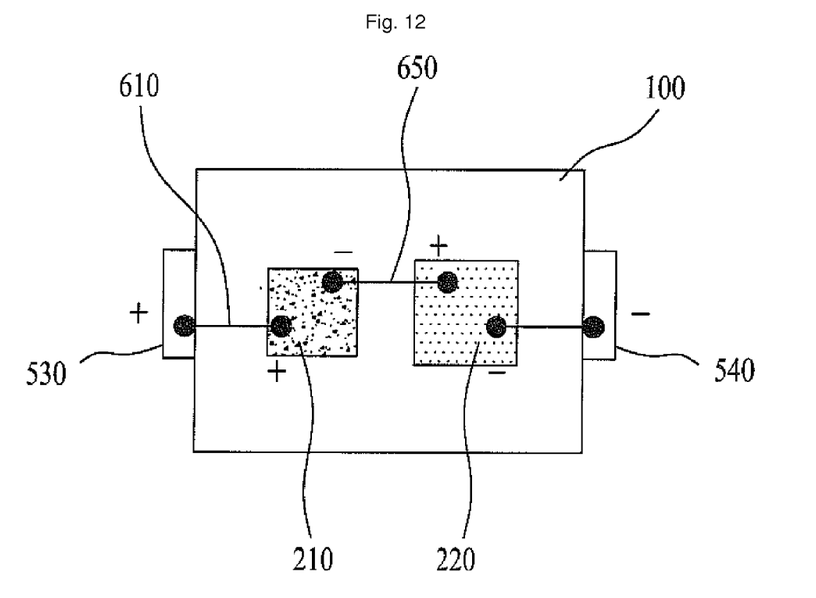
FIG. 12 is a schematic view illustrating another example of the light emitting device package.

As shown in FIG. 12, optical characteristics desired by the package, such as color coordinates, luminance, etc., are controlled by adjusting sizes of the light emitting device chips 210 and 220. The sizes of light emitting device chips are set as small, middle, large, etc. in advance while manufacturing the chips, and an example of the actual sizes of the chips may be as stated in Table 1 below.

TABLE 1

| Chip | Size (mm$^2$) | Current Condition |
|---|---|---|
| Small (0.1 W level) | 0.3 × 0.3 | 20 mA |
| Middle (0.5 W level) | 0.5 × 0.5 | 150 mA |
| Large (1 W level) | 1 × 1 | 350 mA |

As stated in Table 1, rated current conditions are varied according to the sizes of the respective light emitting device chips. This directly influences optical characteristics of the chips.

When a package is manufactured using these characteristics of light emitting device chips, luminance and color coordinates of a lighting apparatus are considerably varied. For example, one case may be a package that uses the blue and green light emitting device chips 210 and 220 having the same size of 0.5×0.5, and another case may be that the package uses the blue light emitting device 210 having a size of 0.5×0.5, the green light emitting device 220 having an increased size of 0.7×0.7 and is driven at a rated current of 150 mA or less. Thus, target specifications, i.e., color coordinates and luminance, can be adjusted by analyzing the relations of luminance and color coordinates according to combinations of light emitting device chips having respective sizes, using differences of the sizes of the light emitting device chips.

Figure 13:
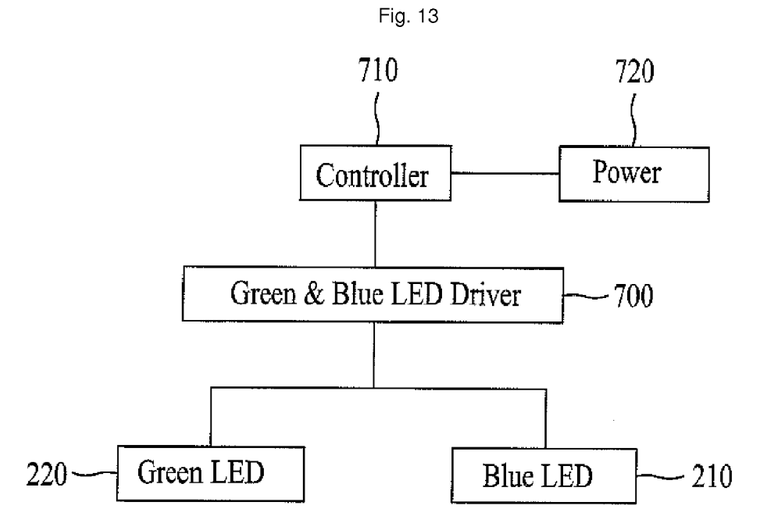
FIG. 13 is a block diagram of an example of a lighting apparatus.

If the above-described light emitting device packages are used, as shown in FIG. 13, a driving unit of the light emitting device package has a simple structure. That is, a single green and blue LED driver 700, which is capable of simultaneously driving the blue light emitting device 210 and the green light emitting device 220, is used. A controller 710 and a power supply 720 are connected to the green and blue LED driver 700.

Due to the above structure and driver, man-hours and cost to manufacture the driver are decreased. Further, the driving method of the package using the driver can be simplified.

The above-described light emitting device package and the lighting apparatus using the same have a color reproduction range of 110% or more, and greatly reduce the number of drivers even though the number of divided regions of the lighting apparatus is increased.

The lighting apparatus may be applied to a backlight unit, and provide a beneficial connection structure between light emitting device chips in the light emitting device package.

Figure 14:
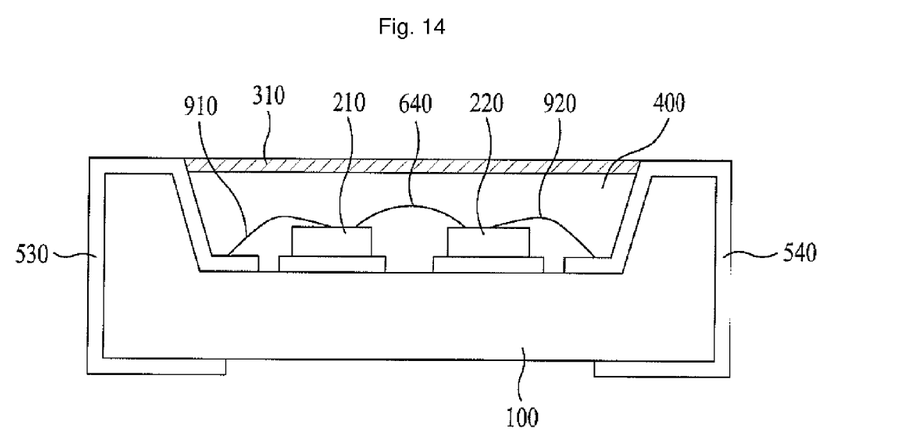
FIG. 14 is a cross-sectional view illustrating the light emitting device package.

FIG. 14 illustrates another embodiment of a light emitting device package. As shown, the embodiment of FIG. 14 is similar to the embodiment of FIG. 7. Namely, the substrate 100 includes a mounting groove, and the blue and green light emitting chips 210 and 220 are disposed on the substrate in the groove. The first electrode 530 and the second electrode 540 are formed on opposite side surfaces of the substrate 100, and extend onto the upper and lower surfaces of the substrate 100. In particular, the first and second electrodes 530 and 540 extend along side walls of the groove in the substrate.

The blue light emitting device chip 210 and the green light emitting device chip 220 are respectively connected to the first electrode 530 and the second electrode 540 by wires 910 and 920, and the blue light emitting device 210 and the green light emitting device 220 are connected to each other in series by the wire 640.

A molding portion 400 made of a transparent resin is located on the light emitting devices 210 and 220, and a phosphor layer 310, which is excited by light emitted from the light emitting devices 210 and 220 and thus emits light, is located on the molding portion 400. As shown, the phosphor layer 310 may have a uniform thickness.

Although FIG. 14 illustrates the phosphor layer 310 located in the groove, in which the light emitting devices 210 and 220 are installed, the phosphor layer 310 may be located outside of the groove. For example, the molding portion 400 may be planar to a top surface of the groove, and the phosphor layer 310 may be formed thereon.

Figure 15:
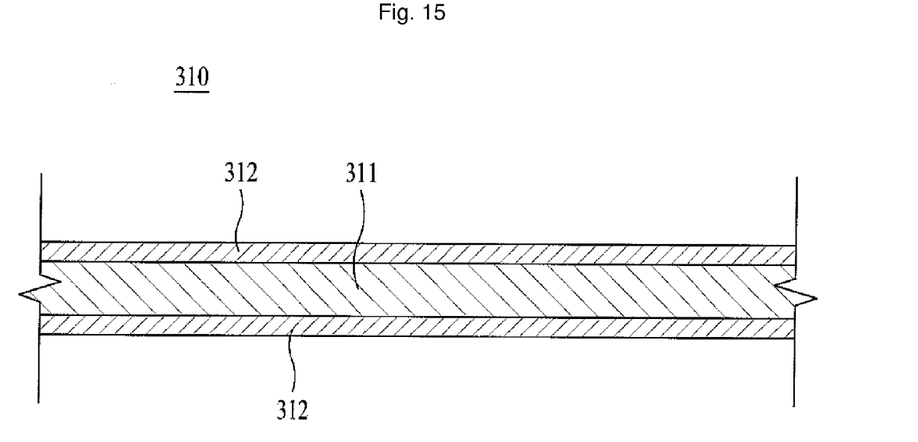
FIG. 15 is a cross-sectional view illustrating a phosphor layer.

Here, the phosphor layer 310 may be a film-type phosphor layer such as the film-type phosphor layer 310 shown in FIG. 15. As shown, the film-type phosphor layer in the embodiment of FIG. 15 includes a phosphor film 311 made of a phosphor powder or a phosphor resin interposed between resin films 312 made of PET.

The phosphor layer 310 in this embodiment includes a red phosphor, which is mixed with light emitted from the blue light emitting device chip 210 and the green light emitting device chip 220, and thus produces white light.

Because the phosphor layer 310 is uniformly thick, the above-described film-type phosphor layer 310 uniformly enhances color temperature and color coordinates, and prevents the generation of a deviation among packages.

The phosphor layer 310 is formed on the molding portion 400 filling the mount groove, in which the light emitting devices 210 and 220 are installed, and thus is simple to manufacture.

Further, the phosphor film 311 made of a phosphor powder or a phosphor resin may be uniformly formed or have a dispersive pattern in consideration of the light distribution of the light emitting devices 210 and 220.

When light emitted from the light emitting device chips 210 and 220 passes through the phosphor layer 310, the phosphor layer 310 serves as a filter and thus produces light having the same color temperature and color coordinates.

Figure 16:
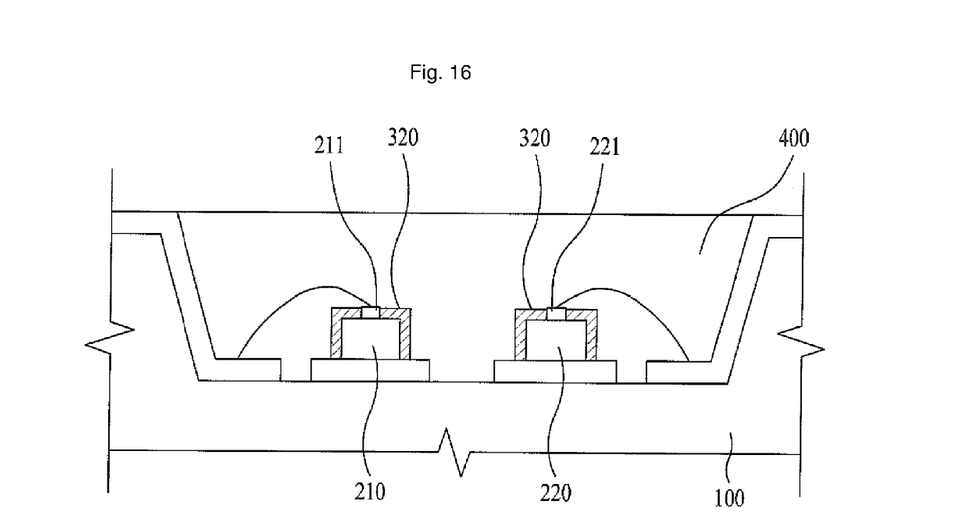
FIG. 16 is a cross-sectional view illustrating the light emitting device package.

FIG. 16 illustrates yet another embodiment of a light emitting device package. The embodiment of FIG. 16 is the same the embodiment of FIG. 14 except that the phosphor layer 310 has been eliminated, and phosphor layers 320 have been formed on the blue and green light emitting device chips 210 and 220. In particular, a phosphor layer 320 having a uniform thickness is formed on each of the respective light emitting devices chips 210 and 220 by a conformal coating Phosphor layer 320 may have the same structure as phosphor layer 310.

The phosphor layer 320 is uniformly coated on the outer surface of each of the light emitting device chips 210 and 220 during a process of manufacturing each of the respective emitting devices 210 and 220 rather than during a process of manufacturing a package.

When the phosphor layer 320 having a regular thickness is formed on each of the light emitting devices 210 and 220, light emitted from the respective light emitting devices 210 and 220 has the same path length passing through the phosphor layer 320, and thus it is possible to emit light having a uniform color. FIG. 16 illustrates a light emitting device package, in which the phosphor layer 320 is uniformly coated on vertical light emitting device chips 210 and 220. As discussed above, vertical light emitting device chips have a bottom electrode and a top electrode. The bottom electrodes may be electrically connected to another element or electrode by wiring patterns formed on the substrate 100, and the top electrodes may be electrically connected to another element or electrode by wire bonding FIG. 16 shows the chips 210 and 220 have upper electrodes 211 and 221 not covered by the phosphor layer 320. For clarity of illustration, the wires connecting the electrodes 530 and 540 as well as the chips 210 and 220 have not been shown. However, these wires will be readily apparent from the description of the previous embodiments.

Figure 17:
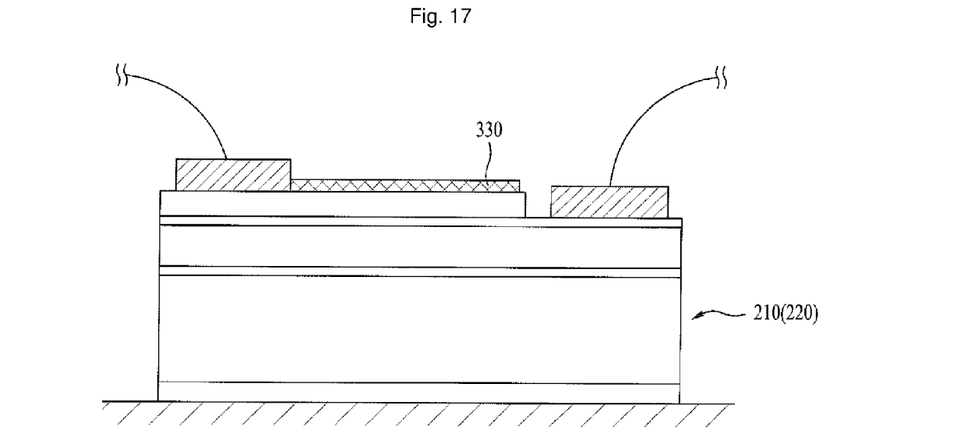
FIG. 17 is a cross-sectional view illustrating one example of a light emitting device.

Beside vertical chips, horizontal light emitting device chips may be used in any of the above embodiments. FIG. 17 illustrates an example of a well-known horizontal light emitting device chip having a phosphor layer 330 uniformly coated thereon. Although FIG. 17 illustrates the phosphor layer 330 formed only on the upper surface of the light emitting device chip, the phosphor layer 330 may be formed on the side surface of the light emitting device chip. Phosphor layer 330 may have the same structure as phosphor layer 310.

Figure 18:
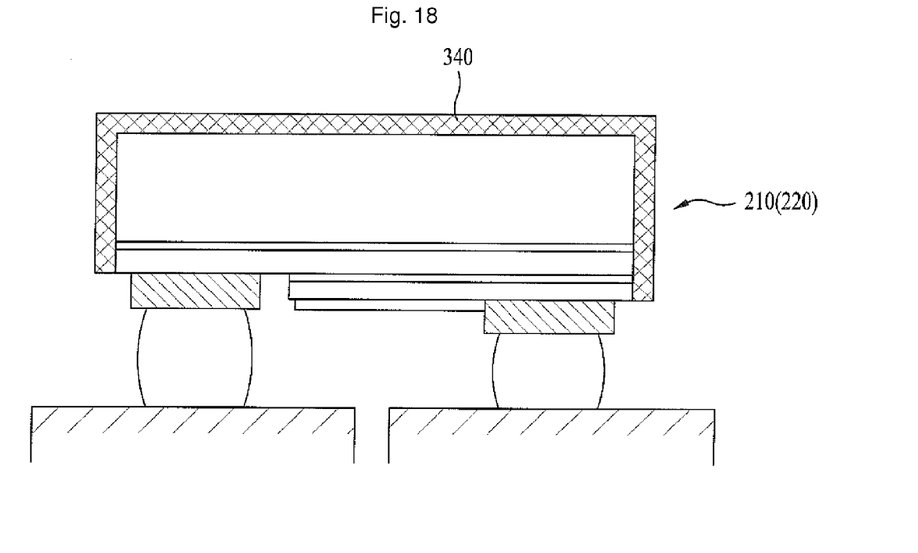
FIG. 18 is a cross-sectional view illustrating another example of the light emitting device.

Also, flip-chip light emitting device chips may be used in any of the above embodiments. FIG. 18 illustrates an example of a flip-chip light emitting device chip having a phosphor layer 340 formed thereon. As shown in FIG. 18, if a light emitting device chip is bonded to a substrate by a flip chip bonding method, a phosphor layer 340 is formed on the rear surface of the light emitting device chip. In this case, the phosphor layer 340 is easily formed. Phosphor layer 340 may have the same structure as phosphor layer 310.

The present invention is not limited to these light emitting device chip structures, and any structure may be used and coated with a uniform phosphor layer as disclosed above.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A light emitting device package, comprising:
a package body having a mounting groove formed therein;
electrodes attached to the package body;
at least two light emitting devices electrically connected to the electrodes, each light emitting device emitting light of a different color from the other light emitting devices, wherein sizes of the at least two light emitting devices are different from each other;
a protective layer formed over the at least two light emitting devices; and
a phosphor layer formed over the protective layer, wherein the at least two light emitting devices and the protective layer are provided in the mounting groove found in the package body and the phosphor layer is provided outside of the mounting groove, and wherein the phosphor layer includes resin films and a phosphor film interposed between the resin films.

2. The light emitting device package according to claim 1, wherein the phosphor layer includes a red phosphor.

3. The light emitting device package according to claim 1, wherein the at least two light emitting devices include a blue light emitting device and a green light emitting device.

4. The light emitting device package according to claim 1, further comprising:
   a heat sink provided on the package body and contacting the at least two light emitting devices.

5. The light emitting device package according to claim 1, wherein the phosphor film is made of one of a phosphor powder or a phosphor resin, and the resin films are made of PET.

6. A lighting apparatus, comprising:
   a light emitting device package including:
      at least two light emitting devices respectively emitting light of a first color and a second color that differ from each other, wherein a size of the light emitting device emitting light of the first color is different than a size of the light emitting device emitting light of the second color; and
      a phosphor formed over the at least two light emitting devices;
   a driver to drive the at least two light emitting devices to emit light of the first and second colors;
   a protective layer formed over the at least two light emitting devices; and
   a phosphor layer formed on the protective layer, wherein the phosphor is contained in the phosphor layer, and
   wherein the light emitting device package includes a mounting groove in which the at least two light emitting devices and the protective layer are provided, with the phosphor layer provided outside of the mounting groove, and wherein the phosphor layer includes resin films and a phosphor layer interposed between the resin films.

7. The lighting apparatus according to claim 6, wherein the first color and the second color are blue and green, respectively.

8. The lighting apparatus according to claim 6, wherein the phosphor is a phosphor to emit red light.

9. The lighting apparatus according to claim 6, wherein the light emitting device emitting light of the first color and the light emitting device emitting light of the second color are connected in one of series or parallel.

* * * * *